(12) United States Patent
Oue et al.

(10) Patent No.: US 7,535,024 B2
(45) Date of Patent: May 19, 2009

(54) DISPLAY DEVICE AND FABRICATION METHOD THEREOF

(75) Inventors: Eiji Oue, Mobara (JP); Toshihiko Itoga, Chiba (JP); Toshiki Kaneko, Chiba (JP); Daisuke Sonoda, Chiba (JP); Takeshi Kuriyagawa, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 63 days.

(21) Appl. No.: 11/600,164

(22) Filed: Nov. 16, 2006

(65) Prior Publication Data

US 2007/0108449 A1    May 17, 2007

(30) Foreign Application Priority Data

Nov. 17, 2005    (JP)    ............................. 2005-332701

(51) Int. Cl.
*H01L 29/04*    (2006.01)
(52) U.S. Cl. ................ 257/72; 257/347; 257/E29.137; 257/E29.151; 257/E29.293; 438/151
(58) Field of Classification Search .................. 257/72, 257/347, 291; 438/151
See application file for complete search history.

(56) References Cited

U.S. PATENT DOCUMENTS

| | | | |
|---|---|---|---|
| 6,259,138 B1 * | 7/2001 | Ohtani et al. | ................ 257/351 |
| 6,469,317 B1 * | 10/2002 | Yamazaki et al. | ............. 257/59 |
| 6,562,671 B2 | 5/2003 | Ohnuma | |
| 6,909,114 B1 | 6/2005 | Yamazaki | |
| 2003/0155594 A1 * | 8/2003 | Ohnuma | ...................... 257/291 |
| 2006/0091387 A1 * | 5/2006 | Yamazaki | ..................... 257/59 |

FOREIGN PATENT DOCUMENTS

JP    2005-167057    *    6/2005

* cited by examiner

*Primary Examiner*—A. Sefer
(74) *Attorney, Agent, or Firm*—Antonelli, Terry, Stout & Kraus, LLP.

(57) ABSTRACT

The present invention provides a fabrication method of a display device which aims at the reduction of fabricating man-hours. In a fabrication method of a display device having a thin film transistor in which a gate electrode includes a first gate electrode and a second gate electrode which is overlapped to the first gate electrode and has a size thereof in the channel direction set smaller than the corresponding size of the first gate electrode, the semiconductor layer includes a channel region which is overlapped to the second gate electrode, a first impurity region which is overlapped to the first gate electrode and is formed outside the second gate electrode, a second impurity region which is formed outside the gate electrode, and a third conductive impurity region which is formed outside the gate electrode and the second impurity region, the first impurity region, the second impurity region and the third impurity region are respectively formed of the same conductive type, the impurity concentration of the first impurity region is lower than the impurity concentration of the third impurity region, and the impurity concentration of the second impurity region is lower than the impurity concentration of the first impurity region, impurities are collectively implanted into both of the first and second impurity regions such that the impurities are implanted into the first impurity region by way of the first gate electrode and the impurities are implanted into the second impurity region such that a peak position of the impurity concentration in the depth direction is positioned below the semiconductor layer thus lowering the impurity concentration of the second impurity region than the impurity concentration of the first impurity region.

4 Claims, 4 Drawing Sheets

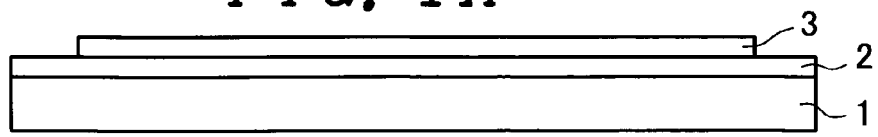
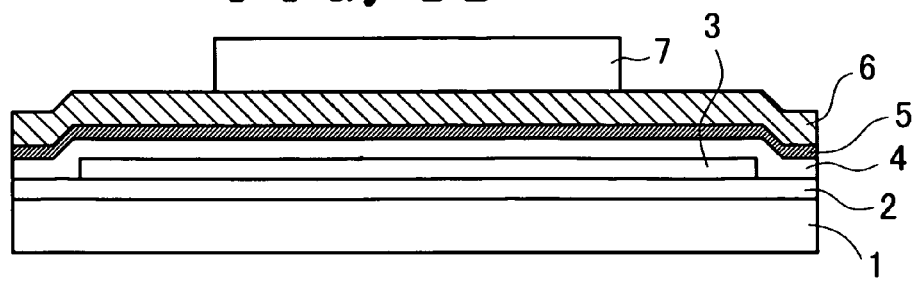
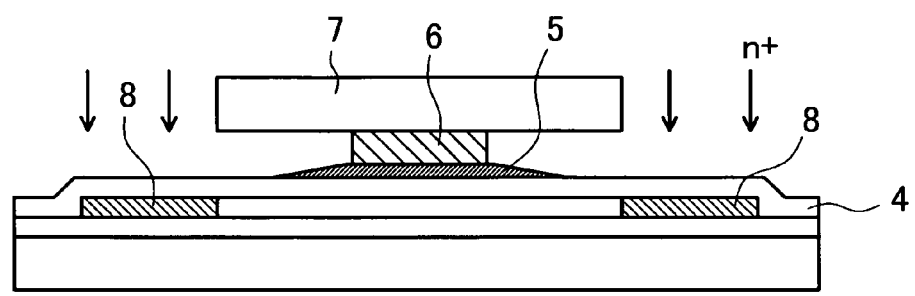
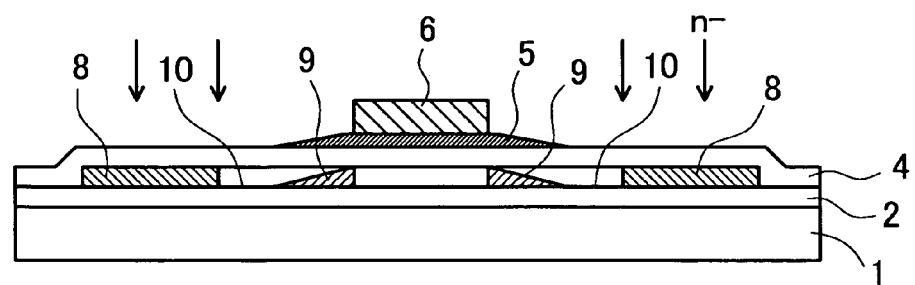
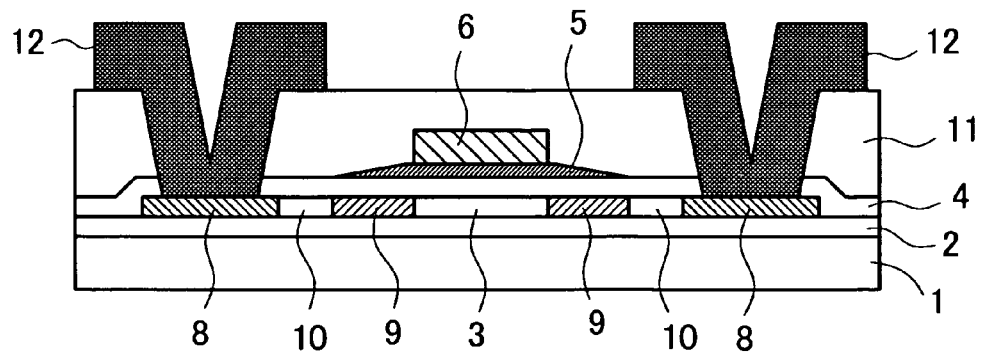

DISPLAY DEVICE AND FABRICATION METHOD THEREOF

The present application claims priority from Japanese application JP2005-332701 filed on Nov. 7, 2005, the content of which is hereby incorporated by reference into this application.

BACKGROUND OF THE INVENTION

The present invention relates to a display device, for example, a display device such as a liquid crystal display device or an organic EL display device and a fabrication method thereof.

This type of display device includes a switching element in the inside of each pixel or in the inside of a circuit portion which is provided outside a display portion which is constituted of these pixels for driving respective pixels.

As such a switching element, there has been known a switching element which uses a thin film transistor in which a polycrystalline silicon layer constitutes a semiconductor layer. In this case, usually, the circuit part is formed on the same substrate which is used as a substrate of a display part and, at the same time, the thin film transistor which is formed in the inside of the circuit part is fabricated in parallel with the thin film transistor in the inside of the pixel.

On the other hand, as the thin film transistor which uses the polycrystalline silicon layer as the semiconductor layer, there has been known a thin film transistor which has, for example, the LDD (Lightly Doped Drain) structure or the GOLD (Gate Overlapped LDD) structure which enhances the properties of the thin film transistor.

In the explanation made hereinafter, the type and the concentration of impurities which are doped in a polycrystalline silicon layer become important. Accordingly, one type of impurities is indicated by n (p-type also being present as another type) and the degree of concentration is indicated by (−) or (+), wherein (−) implies that the concentration is relatively low and (+) implies that the concentration is relatively high. Further, (−−) indicates that the concentration is set lower than the concentration in the case of (−). Here, it should be understood that the concentrations indicated by these symbols are relative values for comparison with other concentrations. That is, the concentration indicated by (n−), for example, does not always imply that the concentration always maintain the value but implies that the concentration is higher compared with the concentration of the case of (n−−) and is lower compared with the concentration of the case of (n).

The thin film transistor having the LDD structure forms an impurity region (n−) of low concentration on a drain end portion by making use of a side wall which constitutes a side wall of a gate electrode thereof, and imparts a gradient to the impurity concentration of a drain junction thus attenuating the concentration of an electric field in the vicinity of a drain. When the thin film transistor is continuously driven, a phenomenon of deterioration such as a lowering of mobility or a so-called ON current, the increase of an OFF current and the like is observed, and this phenomenon is attributed to hot carriers which are generated due to a high electric field in the vicinity of the drain.

Further, the thin film transistor having the GOLD structure forms a region corresponding to the above-mentioned impurity region (n−) in an end portion of the gate electrode in an over lapped manner thus suppressing a so-called hot carrier suppressing effect. Although the drain dielectric strength is enhanced by adopting the LDD structure, the resistance of the impurity region (n−) is large and hence, a drain current is decreased and, at the same time, a high electric field region exists in the impurity region (n−), wherein the collisional ionization becomes maximum in the high electric field region and hence, hot electrons are injected into a gate insulation film on the impurity region (n−) whereby the impurity region (n−) is depleted thus further increasing the resistance.

Although the LDD structure exhibits the high OFF current suppressing effect, the LDD structure has a serious drawback that the hot carrier suppressing effect attributed to the attenuation of the electric field in the vicinity of the drain is small, while although the GOLD structure exhibits the large hot carrier suppressing effect compared to the LDD structure, there exists a serious drawback that the OFF current is increased.

Accordingly, in constituting the above-mentioned display device, it is preferable to use the thin film transistor having the LDD structure as the thin film transistor in each pixel, while it is preferable to use the thin film transistor having the GOLD structure as the thin film transistor in a circuit part.

In this case, it is inevitable for the display device to form the thin film transistors having the different structures from each other in the display part and the circuit part and hence, fabrication steps become cumbersome. In view of such circumstances, the thin film transistor having the new structure which possesses features of both these thin film transistors simultaneously has been proposed and such a thin film transistor is disclosed in JA-A-2002-190479 and JA-A-2001-94113.

That is, in such a thin film transistor, a gate electrode includes a first gate electrode and a second gate electrode which is overlapped to the first gate electrode and has a size thereof in the channel direction set smaller than the corresponding size of the first gate electrode, while a semiconductor layer includes a channel region which is overlapped to the second gate electrode, a first impurity region which is overlapped to the first gate electrode and is formed outside the second gate electrode, a second impurity region which is formed outside the gate electrode, and a third conductive impurity region which is formed outside the gate electrode and the second impurity region, wherein the first impurity region, the second impurity region and the third impurity region are respectively formed of the same conductive type, the impurity concentration of the first impurity region is lower than the impurity concentration of the third impurity region, and the impurity concentration of the second impurity region is lower than the impurity concentration of the first impurity region.

Such constitution is, when the respective impurity regions are formed of n type, for example, constituted of respective layers of (n−), (n−−), (n+) outwardly from directly below the first gate electrode in the inside of the semiconductor layer (see JP-A-2002-190479).

Here, although JP-A-2001-94113 discloses the thin film transistor having the constitution similar to the constitution of the above-mentioned thin film transistor, the impurity concentration of the corresponding the second impurity region is set higher than the impurity concentration of the corresponding first impurity region thus providing the constitution different from the thin film transistor which the present invention aims at.

That is, the thin film transistor shown in JP-A-2001-94113 is, when the respective impurity regions are formed of n type, for example, constituted of the respective layers of (n−), (n), (n+) outwardly directly below the first gate electrode in the inside of the semiconductor layer.

SUMMARY OF THE INVENTION

However, the thin film transistor having the constitution shown in JP-A-2002-190479 has a drawback that man-hours are increased in the fabrication of the thin film transistor.

That is, in the above-mentioned JP-A-2002-190479, in forming the respective layers of (n−), (n−−), (n+) outwardly from directly below the gate electrode which constitutes an upper layer in the polycrystalline silicon layer, it is necessary to perform a photo mask step twice and ion implantation three times.

Further, in the above-mentioned case, a so-called back-surface exposure technique is adopted to suppress the number of photo mask steps and hence, there also arises a drawback that a special apparatus is required for the back-surface exposure step.

The present invention has been made under such circumstances and it is an object of the present invention to provide a fabrication method of a display device which can reduce fabricating man-hours.

To briefly explain the summary of typical invention among inventions disclosed in this specification, they are as follows.

(1) The present invention is directed to a fabrication method of a display device having a thin film transistor which is, for example, constituted of a semiconductor layer, a gate electrode which is formed above the semiconductor layer, and a gate insulation film which is formed between the semiconductor layer and the gate electrode, wherein the gate electrode includes a first gate electrode and a second gate electrode which is overlapped to the first gate electrode and has a size thereof in the channel direction set smaller than the corresponding size of the first gate electrode, the semiconductor layer includes a channel region which is overlapped to the second gate electrode, a first impurity region which is overlapped to the first gate electrode and is formed outside the second gate electrode, a second impurity region which is formed outside the gate electrode, and a third conductive impurity region which is formed outside the gate electrode and the second impurity region, and the first impurity region, the second impurity region and the third impurity region are respectively formed of the same conductive type, the impurity concentration of the first impurity region is lower than the impurity concentration of the third impurity region, and the impurity concentration of the second impurity region is lower than the impurity concentration of the first impurity region, wherein impurities are collectively implanted into both of the first and second impurity regions such that the impurities are implanted into the first impurity region by way of the first gate electrode and the impurities are implanted into the second impurity region such that a peak position of the impurity concentration in the depth direction is positioned below the semiconductor layer thus lowering the impurity concentration of the second impurity region than the impurity concentration of the first impurity region.

(2) The present invention is directed to a display device having a thin film transistor which is, for example, constituted of a semiconductor layer, a gate electrode which is formed above the semiconductor layer, and a gate insulation film which is formed between the semiconductor layer and the gate electrode, wherein the gate electrode includes a first gate electrode and a second gate electrode which is overlapped to the first gate electrode and has a size thereof in the channel direction set smaller than the corresponding size of the first gate electrode, the semiconductor layer includes a channel region which is overlapped to the second gate electrode, a first impurity region which is overlapped to the first gate electrode and is formed outside the second gate electrode, a second impurity region which is formed outside the gate electrode, and a third conductive impurity region which is formed outside the gate electrode and the second impurity region, and the first impurity region, the second impurity region and the third impurity region are respectively formed of the same conductive type, the impurity concentration of the first impurity region is lower than the impurity concentration of the third impurity region, and the impurity concentration of the second impurity region is lower than the impurity concentration of the first impurity region, and impurities in the second impurity region have a peak position of the impurity concentration in the depth direction positioned below the semiconductor layer.

Here, the present invention is not limited to the above-mentioned constitution and various modifications are conceivable without departing from the technical concept of the present invention.

In the fabrication method of a display device having such a constitution, the thin film transistor, in forming the first impurity region and the second impurity region in the region defined between the channel region and source/drain region (the third impurity region) of the semiconductor layer, sets the doping energy of impurities different from the conventional doping energy of impurities by making use of the first gate electrode which is formed above the first impurity region thus realizing the formation of the first impurity region and the second impurity region with ion implantation of only one time. Further, in such an operation, the first gate electrode and the second gate electrode which are already formed by patterning are utilized as masks. Accordingly, the fabrication method of the display device of the present invention adopts the constitution which does not use so-called photo masks thus largely reducing the fabricating man-hours.

BRIEF DESCRIPTION OF THE DRAWING

FIG. 1A to FIG. 1E are a flow chart showing one embodiment of a fabrication method of a display device according to the present invention;

DESCRIPTION OF THE PREFERRED EMBODIMENTS

Figure 2A:
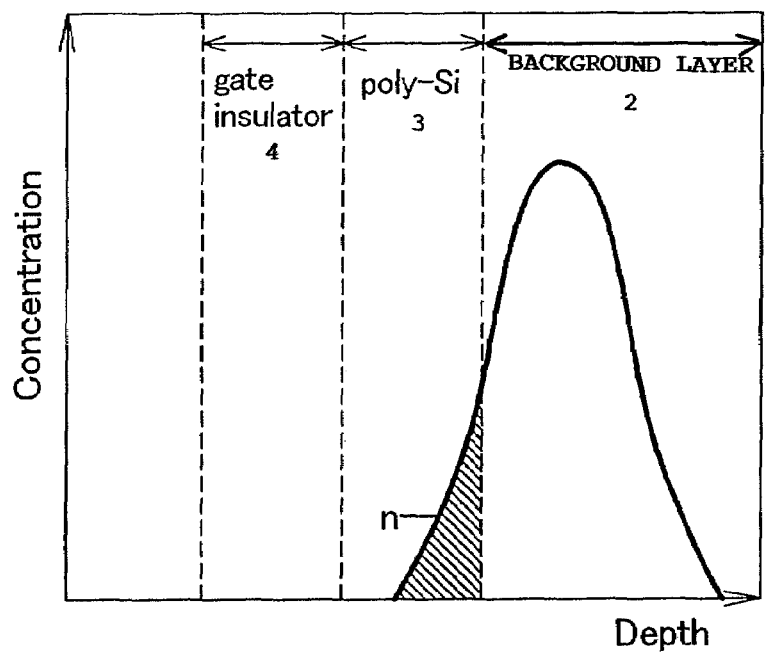
FIG. 2A and FIG. 2B are graphs showing the relationship between the concentration distribution of impurity ions which are injected in steps shown in FIG. 1A to FIG. 1E in the depth direction and portions where a polycrystalline silicon layer is formed.

Embodiments of a fabrication method of a display device according to the present invention are explained hereinafter.

Here, although the explanation is made hereinafter describes a fabrication method of a thin film transistor which is incorporated into the display device, the fabrication of the thin film transistor should be understood as a part of a series of fabrication steps of the display device.

That is, the display device includes a substrate which constitutes a display screen, a large number of pixels are arranged on a surface of the substrate in a matrix array, and a mass of these respective pixels constitutes a display part. A drive circuit which drives the respective pixels is provided outside the display part, and groups of pixels each of which is formed of respective pixels arranged in parallel in the row direction, for example, are sequentially selected in the column direction by the drive circuit and, at the same time, video signals are supplied to the respective pixels of the selected group of pixels.

Further, a large number of thin film transistors are incorporated into the drive circuit and, at the same time, the thin film transistor for selecting the group of pixels and for supplying video signals is provided to each pixel.

FIG. 1 is the step views showing one embodiment of the fabrication method of a display device according to the present invention. Hereinafter, the fabrication method of the display device is explained in order of steps.

Step 1.

As shown in FIG. 1A, a substrate 1 made of glass, for example, is prepared, and a background layer 2 is formed on a main surface of the substrate 1. The background layer 2 is formed of a silicon oxide film (SiO), a silicon nitride film (SiN) or the like and has a function of preventing an ionic material in the substrate 1 from intruding into a thin film transistor TFT described later.

An amorphous silicon layer is formed over the whole region of the surface of the background layer 2, and excimer layer beams are radiated to the amorphous silicon layer to polycrystallize the amorphous silicon layer. Further, the polycrystallized silicon layer is formed into an island-like polycrystalline silicon layer 3 by selective etching method using a photolithography technique.

Here, the selective etching method using the photolithography technique is a method in which a photoresist film is formed on an upper surface of a film to be etched, selective exposure and development are applied to the photoresist film to remove portions of the photoresist film corresponding to a pattern to be formed by the etched film, and the film to be etched is selectively etched using the remaining photoresist film as a mask.

Step 2.

As shown in FIG. 1B, an insulation film 4 which is formed of a silicon oxide film, for example, is formed over the whole region of a main surface of the substrate 1 such that the insulation film 4 also covers the polycrystalline silicon layer 3. Thereafter, p-type impurities are implanted through the insulation film 4. This implantation is the ion implantation for imparting the predetermined impurity concentration to a channel region of the polycrystalline silicon layer 3 in the thin film transistor TFT.

Further, over the whole region of an upper surface of the polycrystalline silicon layer 3, a lower gate metal layer 5 and an upper gate metal layer 6 are sequentially formed by stacking.

Here, although the upper gate metal layer 6 and the lower gate metal layer 5 are selectively etched using the same etchant in a succeeding step, respective materials of the upper gate metal layer 6 and the lower gate metal layer 5 are selected such that an etching rate of the lower gate metal layer 5 is smaller than an etching rate of the upper gate metal layer 6.

Then, a photoresist film 7 is selectively made to remain on an upper surface of the upper gate metal layer 6 using a photolithography technique.

The remaining photoresist film 7 is positioned above a gate electrode of the thin film transistor TFT (and a wiring layer which is connected to the gate electrode), and functions as a mask at the time of forming the gate electrode from the upper gate metal layer 6 and the lower gate metal layer 5 by selective etching.

Step 3.

As shown in FIG. 1C, by immersing at least a main surface of the substrate 1 into an etchant, the upper gate metal layer 6 and the lower gate metal layer 5 arranged below the upper gate metal layer 6 which are exposed from the photoresist film 7 are etched.

In this etching process, the upper gate metal layer 6 directly below the photoresist film 7 is etched also from a side surface thereof in the direction parallel to the substrate 1 (so-called side etching) and, at the same time, the lower gate metal layer 5 below the upper gate metal layer 6 which is side-etched is etched with a gradient imparted to an upper surface thereof such that a film thickness thereof is gradually increased from 0 in the direction of side etching.

Accordingly, the upper gate metal layer 6 is formed in a shape that the upper gate metal layer 6 has a peripheral side surface at a portion which is retracted in wardly from a peripheral side surface of the photoresist film 7 by a predetermined distance, and the lower gate metal layer 5 is formed in a shape such that the lower gate metal layer 5 is flared from a contact portion thereof with the peripheral side surface of the upper gate metal layer 6 to a surface of the insulation film 4.

These shapes of the upper gate metal layer 6 and the lower gate metal layer 5 play important roles in advantageous effects of the present invention with respect to doping of impurities in the succeeding step.

The reason that the upper gate metal layer 6 and the lower gate metal layer 5 are respectively formed into the above-mentioned shapes is that the respective materials of the upper gate metal layer 6 and the lower gate metal layer 5 are selected such that the etching rate of the upper gate metal layer 6 becomes larger than the etching rate of the lower gate metal layer 5.

Accordingly, by sufficiently increasing a ratio between the etching rate of the upper gate metal layer 6 and the etching rate of the lower gate metal layer 5, a so-called taper angle of the peripheral side surface of the upper gate metal layer 6 may be decreased, and the peripheral side surface of the upper gate metal layer 6 may be set substantially perpendicular to the substrate 1.

Thereafter, while allowing the photoresist film 7 to remain as it is, the implantation of impurities is performed. This implantation of impurities aims at the formation of source and drain electrodes in the inside of a polycrystalline silicon layer 3 of the thin film transistor TFT. Accordingly, the impurity concentration is the high concentration and, for example, the (n+) type impurities are selected. Accordingly, the high-concentration n-type polycrystalline region 8 is formed in regions where the source electrode and the drain electrode are formed.

Here, a source and a drain of the thin film transistor TFT are originally determined based on a bias polarity between the source and drain, and a transistor used in a display device usually has a polarity thereof inverted during an operation thereof and hence, it is understood that the source and drain are changed during the operation.

Step 4.

Figure 4A:
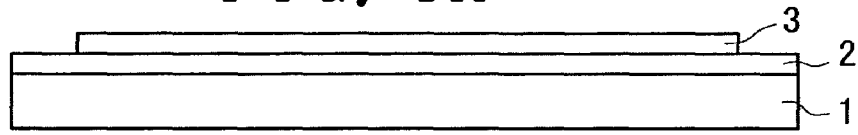
FIG. 4A to FIG. 4E are a flow chart showing another embodiment of a fabrication method of a display device according to the present invention.
Figure 4B:
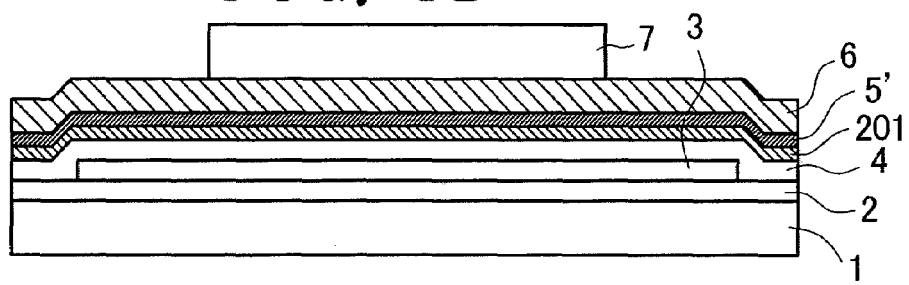
Figure 4C:
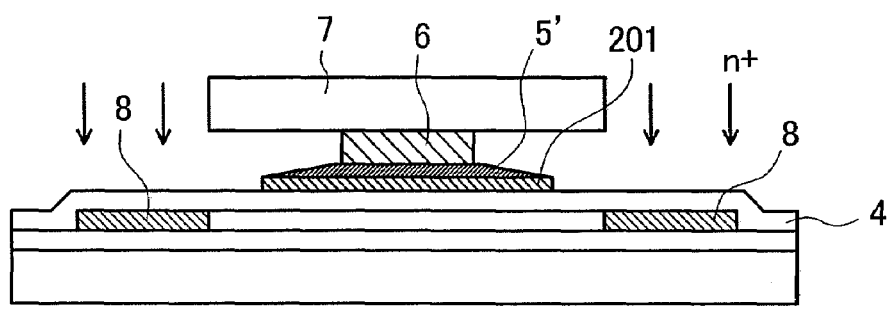
Figure 4D:
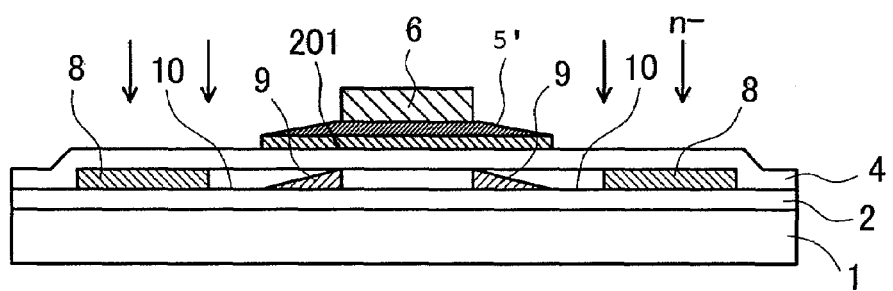

As shown in FIG. 4D, the photoresist film 7 is removed. Then, the low-concentration (n−) type impurity ions are injected from above the main surface of the substrate 1 thus doping the polycrystalline silicon layer 3 with the (n−) type impurity ions to form an n-type semiconductor layer.

In this case, although the doping of impurity ions exhibits the so-called Gaussian distribution in which a doping quantity is changed with a peak at a predetermined position in the depth direction of a layer to be doped, in doping the (n−) type impurity ions, the (n−) type impurity ions are injected by setting the doping energy such that the peak is positioned below the polycrystalline silicon layer 3 at the substrate 1 side in portions where the gate electrode (the upper gate metal layer 6 and the lower gate metal layer 5) is not formed.

FIG. 2A is a graph showing the impurity concentration which assumes the Gaussian distribution such that the peak is positioned lower than the polycrystalline silicon layer 3 at the substrate 1 side in the portions where the upper gate metal layer 6 and the lower gate metal layer 5 are not formed. In the graph, the injection depth direction is taken on an axis of abscissas and impurity concentration is taken on an axis of ordinates.

Further, in the drawing, the presence position of the gate insulation film is indicated by "gate insulator" and the presence position of the polycrystalline silicon layer 3 is indicated as "poly-Si" in the injection depth direction.

Accordingly, in the polycrystalline silicon layer 3, a region (indicated by numeral 10) between the region directly below the lower gate metal layer 5 and the high-concentration n-type polycrystalline region 8 is doped with the concentration (n−−) lower than the concentration (n−) set in the injection of impurities.

In injecting the (n−) type impurity ions, the upper gate metal layer 6 functions as a substantially complete mask, while the lower gate metal layer 5 functions as a mask which allows the impurity ions to partially pass through the lower gate metal layer 5 depending on a film thickness of the lower gate metal layer 5.

That is, the lower gate metal layer 5 is, as described above, formed in a tapered shape in which the lower gate metal layer 5 is flared from the contact portion with the peripheral side surface of the upper gate metal layer 6 to the surface of the insulation film 4 and hence, a doping quantity of (n−) type impurities to the polycrystalline silicon layer 3 is decreased substantially linearly from the periphery of the lower gate metal layer 5 to the peripheral side wall of the upper gate metal layer 6. This is because that the acceleration of the (n−) type impurity ions which penetrate the lower gate metal layer 5 is lowered from the periphery of the lower gate metal layer 5 to the peripheral side surface of the upper gate metal layer 6.

Figure 2B:
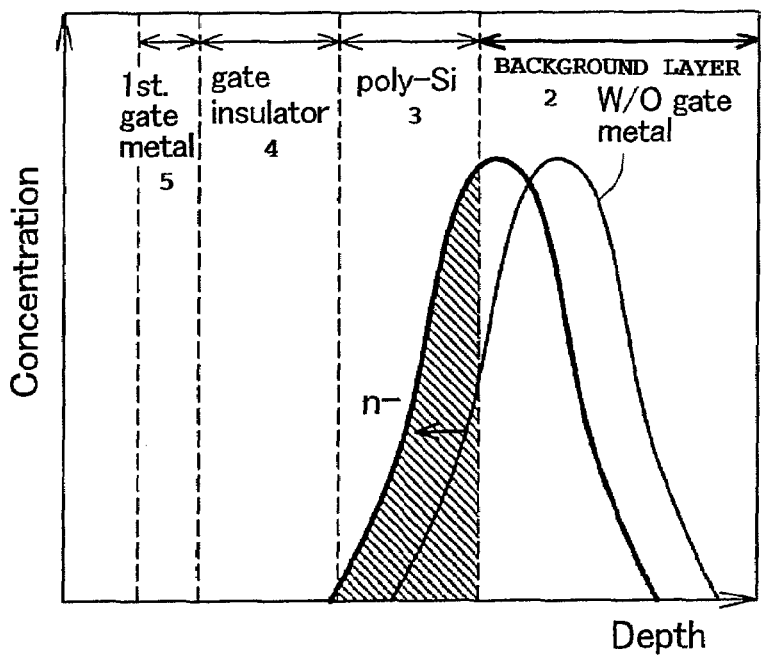

FIG. 2B is a graph corresponding to FIG. 2A and shows the concentration distribution characteristic of impurities which are injected through the lower gate metal layer 5 outside the upper gate metal layer 6. Further, for a comparison purpose, the characteristic shown in FIG. 2B is depicted in an overlapped manner with the characteristic shown in FIG. 2A. Here, FIG. 2B shows the presence position of the lower gate metal layer 5 as "1st gate metal" in the drawing besides the presence positions of the background layer (gate insulation film) 2 and the polycrystalline silicon layer 3.

With respect to the concentration distribution characteristic of the impurities injected through the lower gate metal layer 5 outside the upper gate metal layer 6, the reason that a peak of the concentration distribution characteristic is displaced compared to the corresponding characteristic shown in FIG. 2A is that the acceleration of the (n−) type impurities which penetrate the lower gate metal layer 5 is decreased due to the lower gate metal layer 5.

That is, the peak approaches closer to the polycrystalline silicon layer 3 side and hence, the polycrystalline silicon layer 3 is doped with a larger quantity of impurities (n−). Accordingly, in a region (indicated by numeral 9) directly below the lower gate metal layer 5 except for a region directly below the upper gate metal layer 6, an impurity region of the concentration (n−) is formed.

Here, the concentration distributions of n-type impurities which are respectively shown in FIG. 2A and FIG. 2B exhibit the exactly same traces also in the completed thin film transistor TFT (including the substrate 1 on which the thin film transistor TFT is formed and the like) and hence, it is possible to determine the position where the peak of the concentration distribution is set by detecting the concentration of the n-type impurities in the depth direction.

Step 5.

As shown in FIG. 1E, an interlayer insulation film 11 is formed over the main surface of the substrate 1 such that the interlayer insulation film 11 also covers the upper gate metal layer 6.

Thereafter, heat treatment (annealing) is performed to activate the impurity ions which are doped in the polycrystalline silicon layer 3 or the like in the preceding step.

Accordingly, the impurity ion concentrations in respective regions in the polycrystalline silicon layer 3 are made uniform, wherein a (p−) impurity layer is formed in the region directly below the upper gate metal layer 6, an (n−) impurity layer is formed in the region directly below the lower gate metal layer 5 outside the region directly below the upper gate metal layer 6, an (n−−) impurity layer is formed in a region in front of the source/drain electrodes outside the region directly below the lower gate metal layer 5, and an (n+) impurity layer is formed in the regions where source/drain electrodes are formed.

Figure 3A:
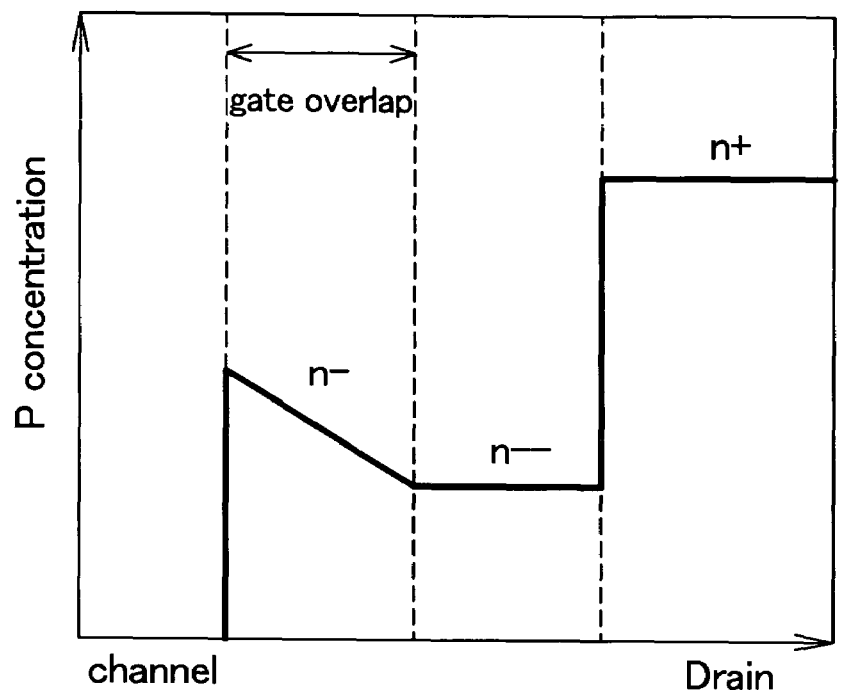
FIG. 3A and FIG. 3B are graphs showing the concentration distribution in the spreading direction of polycrystalline silicon in a completed thin film transistor.

FIG. 3A is a graph showing the distribution of the n-type impurity concentration in the flaring direction of the polycrystalline silicon layer 3, wherein a region directly below the upper gate metal layer 6 is indicated by "channel" in the drawing, a region directly below the lower gate metal layer 5 outside the upper gate metal layer 6 is indicated by "gate overlap", and the drain region is indicated by "Drain".

Here, the impurity concentration of the region directly below the lower gate metal layer 5 outside the upper gate metal layer 6 exhibits the distribution in which the impurity concentration is gradually decreased to the outside from the periphery of the upper gate metal layer 6. This is because that the impurity concentration of the region corresponds to the formation of the lower gate metal layer 5 which changes a film thickness thereof.

Further, contact holes are formed in predetermined portions of the interlayer insulation film 11 so as to expose respective portions of the source electrode and the drain electrode, and the source electrode and the drain electrode are connected with wiring layers 12 formed on the interlayer insulation film 11 at the exposed portions thus completing the fabrication of the thin film transistor TFT.

The thin film transistor which is fabricated in this manner, in forming the (n−) impurity layer and the (n−−) impurity layer in the region defined between the channel region and source/drain region of the polycrystalline silicon layer, sets the doping energy of impurities different from the conventional doping energy of the impurities by making use of the lower gate metal layer 5 which is formed above the (n−) impurity layer thus realizing the formation of the (n−) impurity layer and the (n--) impurity layer with ion implantation of only one time. Further, in such an operation, the upper gate metal layer 6 and the lower gate metal layer 5 which are already formed by patterning are utilized as masks. Accordingly, the fabrication method of the display device of this embodiment adopts the constitution which does not use so-called photo masks.

Accordingly, the fabricating man-hours can be largely reduced.

FIG. 4A to FIG. 4E are a flow chart showing another embodiment of the fabrication method of a display device according to the present invention.

The constitution which makes this embodiment differ from the embodiment 1 lies in that a gate electrode of a thin film transistor TFT which is completed in the fabrication includes the three layered structure consisting of an upper gate metal layer 6, an intermediate gate metal layer 5' and another lower gate metal layer 201, and due to such difference in constitution, this embodiment differs from the embodiment 1 with respect to a portion of the fabrication step sandal so differs in the impurity concentration in the flaring direction of a polycrystalline silicon layer 3.

Hereinafter, the fabrication method of a display device of this embodiment is explained in order of steps.

Step 1.

As shown in FIG. 4A, a substrate 1 made of glass, for example, is prepared, and a background layer 2 is formed on a main surface of the substrate 1. The background layer 2 is formed of a silicon oxide film (SiO), a silicon nitride film (SiN) or the like and has a function of preventing an ionic material in the substrate 1 from intruding into a thin film transistor TFT described later.

An amorphous silicon layer is formed over the whole region of the surface of the background layer 2, and Excimer layer beams are radiated to the amorphous silicon layer to polycrystallize the amorphous silicon layer. Further, the polycrystallized silicon layer is formed into an island-like polycrystalline silicon layer 3 by selective etching method using a photolithography technique.

Step 2.

As shown in FIG. 4B, an insulation film 4 which is formed of a silicon oxide film, for example, is formed over the whole region of a main surface of the substrate 1 such that the insulation film 4 also covers the polycrystalline silicon layer 3. Thereafter, for example, p-type impurities are implanted through the insulation film 4. This implantation is the ion implantation for imparting the predetermined type and impurity concentration to a channel region of the thin film transistor TFT.

Further, over the whole region of an upper surface of the polycrystalline silicon layer 3, another lower gate metal layer 201, an intermediate gate metal layer 5' and an upper gate metal layer 6 are sequentially formed by stacking.

Here, although the upper gate metal layer 6, the intermediate gate metal layer 5' and another lower gate metal layer 201 are selectively etched using the same etchant in a succeeding step, respective materials of the upper gate metal layer 6, the intermediate gate metal layer 5' and another lower gate metal layer 201 are selected such that an etching rate of the intermediate gate metal layer 5' is smaller than etching rates of the upper gate metal layer 6 and another lower gate metal layer 201.

Accordingly, the upper gate metal layer 6 and another lower gate metal layer 201 maybe respectively made of the same material.

Then, a photoresist film 7 is selectively made to remain on an upper surface of the upper gate metal layer 6 using a photolithography technique.

The remaining photoresist film 7 is positioned above a gate electrode of the thin film transistor TFT (and a wiring layer which is connected to the gate electrode), and functions as a mask at the time of forming the gate electrode from the upper gate metal layer 6, the intermediate gate metal layer 5' and another lower gate metal layer 201 by selective etching.

Step 3.

As shown in FIG. 4C, by immersing at least a main surface of the substrate 1 into an etchant, the upper gate metal layer 6, the intermediate gate metal layer 5' and another lower gate metal layer 201 which are exposed from the photoresist film 7 are etched.

In this etching process, the upper gate metal layer 6 directly below the photoresist film 7 is etched also from a side surface thereof in the direction parallel to the substrate 1 (so-called side etching) and, at the same time, the intermediate gate metal layer 5' below the upper gate metal layer 6 which is side-etched is etched with a gradient imparted to an upper surface thereof such that a film thickness thereof is gradually increased from 0 in the direction of side etching.

In this case, an outer periphery of the intermediate gate metal layer 5'in a planar pattern is positioned slightly inside than the peripheral side surface of the photoresist film 7, another lower gate metal layer 201 which is present outside the outer periphery of the intermediate gate metal layer 5' is etched until a surface of an insulation film 4 is exposed, and an outer periphery of another lower gate metal layer 201 in a planar pattern is substantially aligned with an outer periphery of the intermediate gate metal layer 5'.

Accordingly, the upper gate metal layer 6 is formed in a shape that the upper gate metal layer 6 has a peripheral side surface at a portion which is retracted in wardly from a peripheral side surface of the photoresist film 7 by a predetermined distance, and the intermediate gate metal layer 5' is formed in a shape such that the intermediate gate metal layer 5' is flared from a contact portion thereof with the peripheral side surface of the upper gate metal layer 6 to an outward of the upper gate metal layer 6 and, another lower gate metal layer 201 is formed directly below the intermediate gate metal layer 5'.

Thereafter, while allowing the photoresist film 7 to remain as it is, the implantation of (n+) type impurities is performed. This implantation of the (n+) type impurities aims at the formation of source and drain electrodes in the inside of a polycrystalline silicon layer 3 of the thin film transistor TFT. Accordingly, the impurity concentration becomes the high concentration. Accordingly, the high-concentration n-type polycrystalline region 8 is formed in regions where the source electrode and the drain electrode are formed.

Step 4.

As shown in FIG. 4D, the photoresist film 7 is removed. Then, the low-concentration (n-) type impurity ions are injected from above the main surface of the substrate 1 thus doping the polycrystalline silicon layer 3 with the (n-) type impurity ions.

In this case, in the same manner as the embodiment, the impurities are injected by setting the doping energy such that a peak of the Gaussian distribution of the impurity concentration in the depth direction is positioned below polycrystalline silicon layer 3 on the substrate 1.

In injecting the (n-) type impurity ions, the upper gate metal layer 6 functions as a substantially complete mask, while the intermediate gate metal layer 5' and another lower gate metal layer 201 function as a mask which allows the impurity ions to partially pass through the intermediate gate metal layer 5' and another lower gate metal layer 201 depending on a film thickness of the intermediate gate metal layer 5' and another lower gate metal layer 201.

To compare with the embodiment 1 which is not provided with the metal layer corresponding to another lower gate metal layer 201, another lower gate metal layer 201 uniformly lowers the acceleration of the impurity ions which are injected by passing through the intermediate gate metal layer 5' and hence, it is possible to control a proper doping quantity of impurity ions in view of a doping quantity of impurity ions which are inputted to an outer region of the intermediate gate metal layer 5'.

Accordingly, in the same manner as the embodiment 1, in the polycrystalline silicon layer 3, a region (indicated by numeral 10) between the region directly below another lower gate metal layer 201 and the high-concentration n-type polycrystalline region 8 is doped with the concentration (n--) lower than the concentration (n-) set in the injection of impurities, while a region (indicated by numeral 9) directly below the intermediate gate metal layer 5' (another lower gate metal layer 201) other than a region directly below the upper gate metal layer 6 is doped with the concentration (n--).

Step 5.

Figure 4E:
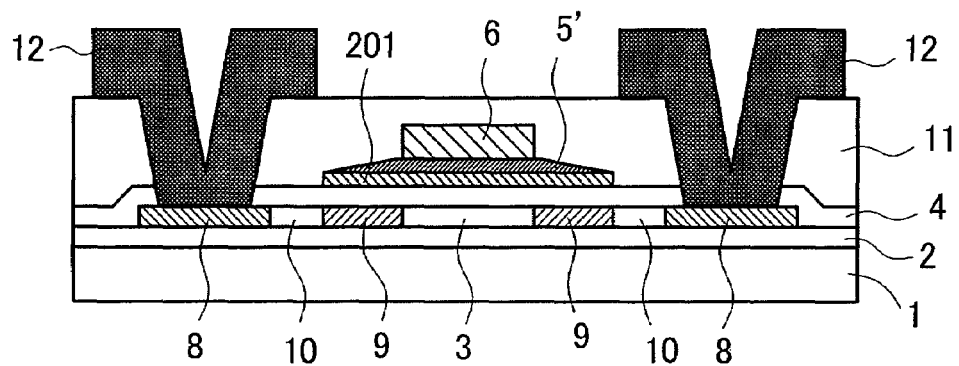

As shown in FIG. 4E, an interlayer insulation film 11 is formed over the main surface of the substrate 1 such that the interlayer insulation film 11 also covers the upper gate metal layer 6.

Thereafter, heat treatment (annealing) is performed to activate the impurity ions which are doped in the polycrystalline silicon layer 3 or the like in the preceding step.

Accordingly, the impurity ion concentrations in respective regions in the polycrystalline silicon layer 3 are made uniform, wherein a p-impurity layer is formed in the region directly below the upper gate metal layer 6, an (n-) impurity layer is formed in the region directly below the intermediate gate metal layer 5' (another lower gate metal layer 201) outside the region directly below the upper gate metal layer 6, a (n--) impurity layer is formed in a region in front of the source/drain electrodes outside the region directly below the intermediate gate metal layer 5', and an (n+) impurity layer is formed in the regions where source/drain electrodes are formed.

Figure 3B:
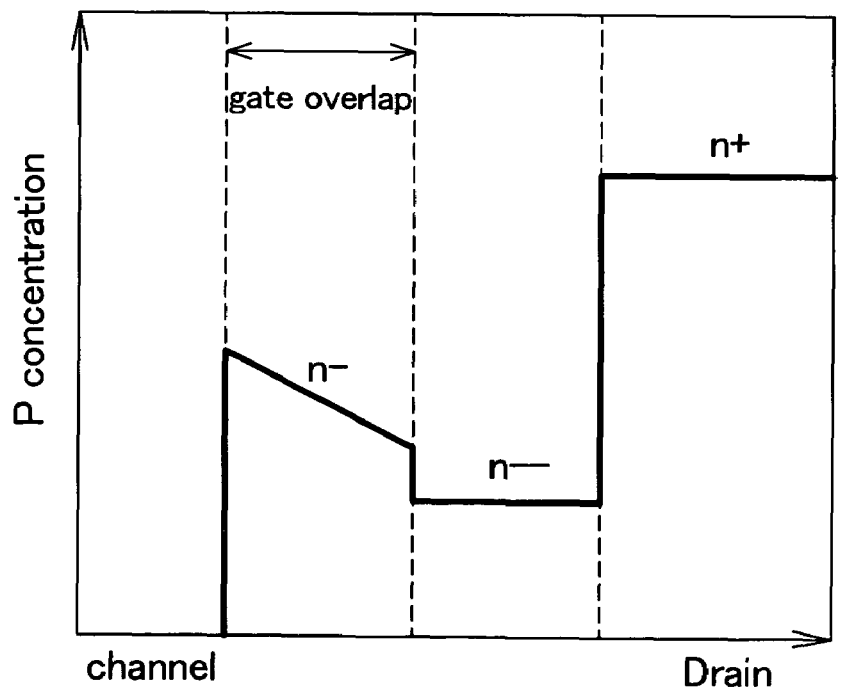

FIG. 3B is a graph which corresponds to FIG. 3A and shows the distribution of the n-type impurity concentration in the flaring direction of the polycrystalline silicon layer 3, wherein a region directly below the upper gate metal layer 6 is indicated by "channel", a region outside the upper gate metal layer 6 and directly below the intermediate gate metal layer 5' (another lower gate metal layer 201) is indicated by "gate overlap", and the drain region is indicated by "Drain".

The constitution which makes this embodiment different from the embodiment shown in FIG. 3 lies in an interface between the (n-) impurity layer and the (n--) impurity layer and the change of concentration having a step is generated in this interface. This is attributed to the provision of another lower gate metal layer 201 having the uniform thickness.

Further, contact holes are formed in predetermined portions of the interlayer insulation film 11 so as to expose respective portions of the source electrode and the drain electrode, and the source electrode and the drain electrode are connected with wiring layers formed on the interlayer insulation film 11 at the exposed portions thus completing the fabrication of the thin film transistor TFT.

In the above-mentioned both embodiments, the explanation has been made with respect to the n-channel-type thin film transistor. However, it is needless to say that the present invention is not limited to such a thin film transistor and the present invention is applicable to the p-channel-type thin film transistor. In this case, although regions other than the region directly below the upper gate metal layer 6 in the polycrystalline silicon layer 3 becomes a p-type semiconductor layer, and impurity ions for forming the regions also become p-type, it is needless to say that the doping energy of impurity ions are set in the above-mentioned manner in the respective steps 4 shown in FIG. 1 and FIG. 4 (respective drawings D).

The above-mentioned respective embodiments may be used either in a single form or in combination. This is because that the advantageous effects of the respective embodiments can be obtained individually or synergistically.

What is claimed is:

1. A fabrication method of a display device having a thin film transistor comprising a semiconductor layer, a gate electrode which is formed above the semiconductor layer, a gate insulation film which is formed between the semiconductor layer and the gate electrode, and a background layer underneath the semiconductor layer, wherein the method includes the steps of:

forming the gate electrode so as to include at least a first gate electrode, and a second gate electrode which overlaps the first gate electrode the second gate electrode having a size thereof in the channel direction which is set smaller than a corresponding size of the first gate electrode;

forming the semiconductor layer so as to include a channel region which is overlapped by the second gate electrode, a first impurity region having a first impurity concentration overlapped by the first gate electrode and formed outside of the second gate electrode so that the second pate electrode does not overlap the first impurity region in the channel direction, a second impurity region having a second impurity concentration formed outside of the second gate electrode so that the second gate electrode does not overlap the second impurity region in the channel direction, and a third conductive impurity region having a third impurity concentration formed outside the gate electrode so that the gate electrode does not overlap the first impurity region in the channel direction and the third conductive impurity region is formed outside of the second impurity region in the channel direction;

wherein the first impurity region, the second impurity region and the third impurity region are respectively formed of the same semiconductor type;

wherein the first impurity concentration is lower than the third impurity concentration, and the second impurity concentration is lower than the first impurity concentration; and wherein impurities are simultaneously implanted into both of the first and second impurity regions using a single process so that the impurities are implanted into the first impurity region through the first gate electrode and the impurities are implanted into the second impurity region so that a peak position of the impurity concentration in a depth direction is located in the background layer underneath the semiconductor layer thus limiting the second impurity concentration below the first impurity concentration.

2. A fabrication method of claim 1, wherein the step of forming the gate electrode includes forming the first gate electrode, the second gate electrode, and forming a third gate electrode arranged between the semiconductor layer and the first gate electrode.

3. A display device having a thin film transistor comprising a semiconductor layer, a gate electrode which is formed above the semiconductor layer, a gate insulation film which is formed between the semiconductor layer and the gate electrode, and a background layer underneath the semiconductor layer, wherein the gate electrode includes at least a first gate electrode and a second gate electrode which overlaps the first gate electrode, the second gate electrode having a size thereof in the channel direction which is set smaller than a corresponding size of the first gate electrode, the semiconductor layer includes a channel region which is overlapped by the second gate electrode, a first impurity region which is overlapped by the first gate electrode and is formed outside of the second gate electrode so that the second gate electrode does not overlap the first impurity region in the channel direction, a second impurity region which is formed outside of the gate electrode so that the gate electrode does not overlap the second impurity region in the channel direction, and a third conductive impurity region which is formed outside of the gate electrode so that the gate electrode does not overlap third impurity region in the channel direction and the third impurity region is formed outside of the second impurity region in the channel direction, and the first impurity region, the second impurity region and the third impurity region are respectively formed of the same semiconductor type, an impurity concentration of the first impurity region is lower than an impurity concentration of the third impurity region, and an impurity concentration of the second impurity region is lower than the impurity concentration of the first impurity region, and impurities in the second impurity region have a peak position of the impurity concentration in a depth direction located in the background layer underneath the semiconductor layer.

4. A display device having a thin film transistor of claim 3, wherein the gate electrode includes the first gate electrode, the second gate electrode, and a third gate electrode arranged between the semiconductor layer and the first gate electrode.

* * * * *